(12) United States Patent
Shibata

(10) Patent No.: US 7,682,898 B2
(45) Date of Patent: Mar. 23, 2010

(54) SEMICONDUCTOR DEVICE AND METHOD FOR FABRICATING THE SAME

(75) Inventor: Yoshiyuki Shibata, Shiga (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 12/073,608

(22) Filed: Mar. 7, 2008

(65) Prior Publication Data

US 2008/0227263 A1      Sep. 18, 2008

Related U.S. Application Data

(62) Division of application No. 11/265,120, filed on Nov. 3, 2005, now Pat. No. 7,408,232.

(30) Foreign Application Priority Data

Jan. 17, 2005  (JP)  ............... 2005-009269

(51) Int. Cl.
  *H01L 27/08* (2006.01)
  *H01L 21/20* (2006.01)

(52) U.S. Cl. ............. 438/253; 438/254; 438/393; 438/396; 257/301; 257/304; 257/306; 257/E21.009; 257/E21.019

(58) Field of Classification Search ........... 438/253, 438/254, 393, 396; 257/253, 301, 304, 306, 257/E21.009, E21.019
See application file for complete search history.

(56) References Cited

U.S. PATENT DOCUMENTS

| 6,335,241 | B1 | 1/2002 | Hieda et al. |
| 6,696,721 | B2 | 2/2004 | Hieda |
| 6,762,107 | B2 | 7/2004 | Watanabe et al. |
| 7,018,893 | B1 | 3/2006 | Kundalgurku |
| 2002/0022317 | A1 | 2/2002 | Fukuzumi |
| 2002/0096757 | A1 | 7/2002 | Takao et al. |
| 2002/0160559 | A1 | 10/2002 | Lee et al. |
| 2002/0190294 | A1 | 12/2002 | Iizuka et al. |
| 2003/0222302 | A1 | 12/2003 | Saito et al. |
| 2007/0108492 | A1* | 5/2007 | Shibata ............... 257/303 |

FOREIGN PATENT DOCUMENTS

| JP | 10-064852 A | 3/1998 |
| JP | 11-026712 | 1/1999 |
| JP | 2000-183214 A | 6/2000 |
| JP | 2002-083880 A | 3/2002 |
| JP | 2002-252351 A | 9/2002 |
| JP | 2002-343889 A | 11/2002 |
| JP | 2002-373945 A | 12/2002 |
| JP | 2003-332468 A | 11/2003 |

OTHER PUBLICATIONS

Japanese Notice of Reasons for Rejection, w/ English translation thereof, issued in Japanese Patent Application No. JP 2005-009269 dated Oct. 13, 2009.

* cited by examiner

*Primary Examiner*—Dao H Nguyen
(74) *Attorney, Agent, or Firm*—McDermott Will & Emery LLP

(57) ABSTRACT

A semiconductor device of the present invention includes a plurality of lower electrodes covering the entire surfaces of a plurality of trenches formed in a first interlayer insulating film, a capacitive insulating film covering the entire surfaces of the plurality of lower electrodes, and an upper electrode covering the surfaces of the plurality of lower electrodes from above with the capacitive insulating film interposed between the upper electrode and the plurality of lower electrodes. The upper electrode is formed with a stress-relieving part, such as a crack, a notch or a recess.

5 Claims, 5 Drawing Sheets

SEMICONDUCTOR DEVICE AND METHOD FOR FABRICATING THE SAME

RELATED APPLICATIONS

This application is a Divisional of U.S. application Ser. No. 11/265,120, filed Nov. 3, 2005, now U.S. Pat. No. 7,408,232, claiming priority of Japanese Application No. 2005-009269, filed Jan. 17, 2005, the entire contents of each of which are hereby incorporated by reference.

BACKGROUND OF THE INVENTION (1) Field of the Invention

The present invention relates to a semiconductor device including capacitors and a method for fabricating the same, and more particularly relates to a semiconductor device having concave DRAM (Dynamic Random Access Memory) capacitors and a method for fabricating the same.

(2) Description of Related Art

In recent years, for DRAMs for which increasing miniaturization is demanded, attention has been directed toward a method in which a metal oxide film having a high permittivity, more particularly, a $TaO_x$ film, is used as a capacitive insulating film of a capacitor to ensure sufficient charge retention characteristics (see, for example, Japanese Unexamined Patent Publication No. 11-026712).

When a $TaO_x$ film is used as a capacitive insulating film and a material having Si as the main ingredient is used as a material of a lower electrode, this can provide a relative permeability of 15 through 20. On the other hand, when a $TaO_x$ film is used as a capacitive insulating film and a metal film is used as a lower electrode, this can provide a relative permeability of 50 at the maximum. As described above, a $TaO_x$ film used as a capacitive insulating film can have three or more times as large a capacitance in the same capacitor area as a $SiO_2$ film or an ON film (a film obtained by stacking a $SiO_2$ film and a $SiN_x$ film) used as a capacitive insulating film.

Furthermore, since a $TaO_x$ film can be formed within a low-temperature range of, for example, 400 through 500° C. by thermal chemical vapor deposition (CVD), it is effective also at reducing the thermal damage to other elements.

In general, when a $TaO_x$ film is used as a capacitive insulating film, a TiN film, which can be formed of a material containing no organic material that may deteriorate the properties of the capacitive insulating film, is selected as an upper electrode. A TiN film is usually formed of a material having $TiCl_4$ and $NH_3$ as the main ingredients by thermal CVD. Since a TiN film can be formed within a temperature range of 400 through 600° C., the formation of the TiN film will not lead to the deteriorated properties of a $TaO_x$ film serving as a capacitive insulating film or other elements, such as transistors.

However, in a DRAM capacitor having a capacitive insulating film of a $TaO_x$ film and an upper electrode of a TiN film, the problem that the stress produced in the TiN film is applied to the $TaO_x$ film has been caused. This problem will be described below in more detail with reference to the drawings. FIG. 5A is a cross-sectional view showing a schematic structure of a known semiconductor device including DRAM capacitors.

As shown in FIG. 5A, the semiconductor device includes a first interlayer insulating film 101, a plurality of lower electrodes 103 of a silicon film formed on the entire surfaces of a plurality of trenches 102 formed in the first interlayer insulating film 101, a capacitive insulating film 104 of a $TaO_x$ film formed to cover the entire surfaces of the lower electrodes 103, an upper electrode 105 of a TiN film partly covering the capacitive insulating film 104, and a second interlayer insulating film 106 covering the upper electrode 105. Each of known DRAM capacitors 100 is formed of one of the lower electrodes 103, the capacitive insulating film 104 and the upper electrode 105. The capacitive insulating film 104 and the upper electrode 105 are formed to cover the entire surfaces of the plurality of trenches 102 and the first interlayer insulating film 101 located outside the trenches 102.

FIG. 5B is an enlarged cross-sectional view showing a part of the structure of the semiconductor device shown in FIG. 5A in which the capacitive insulating film 104 and the upper electrode 105 are successively stacked on the first interlayer insulating film 101, i.e., a part thereof surrounded by broken lines in FIG. 5A. As shown in FIG. 5B, the first interlayer insulating film 101, the capacitive insulating film 104 and the upper electrode 105 are successively stacked to make contact with one another.

FIG. 5C is a plan view showing a schematic structure of a DRAM array region in which a plurality of DRAM capacitors 100 are arranged. As shown in FIG. 5C, the DRAM capacitors 100 are arranged in a matrix of rows and columns. For example, several 10 k through 1 G capacitors are arranged in a single array. In this structure, an upper electrode 105 is formed to cover a plurality of trenches 102 and have a large area. The formation of such a large-area upper electrode 105 increases the stress of the upper electrode 105 itself, leading to stress concentration at a specific DRAM capacitor.

FIG. 5D is a diagram showing the state of the stress applied to a DRAM capacitor 100 and its vicinity. As shown in FIG. 5D, the stress concentrates, in particular, at part of the upper electrode 105 covering the first interlayer insulating film 101 located outside the trenches 102. When this stress reaches the capacitive insulating film 104, the capacitive insulating film 104 is deteriorated in its leakage current characteristics and charge retention characteristics. Such deterioration in initial characteristics, such as the leakage current characteristics and the charge retention characteristics, facilitates an electrical breakdown, leading to the reduced long-term reliability.

SUMMARY OF THE INVENTION

It is an object of the present invention to provide a DRAM capacitor that suppresses the deterioration of a capacitive insulating film by taking a measure to reduce the stress produced in an upper electrode.

According to one aspect of the present invention, a semiconductor device having a plurality of capacitors includes: a plurality of lower electrodes; a capacitive insulating film formed on the plurality of lower electrodes; an upper electrode covering the surfaces of the plurality of lower electrodes from above with the capacitive insulating film interposed between the upper electrode and the plurality of lower electrodes and having a stress-relieving part, each said capacitor including one of the lower electrodes, the capacitive insulating film and the upper electrode.

In the above semiconductor device, the stress-relieving part is more particularly a crack, a notch or a recess.

The above semiconductor device may further include an insulating film formed with a plurality of trenches, wherein each said lower electrode may cover the entire surfaces of each said trench, and the upper electrode may cover the entire surfaces of the trenches and the insulating film located outside the plurality of trenches (concave capacitors).

In the above semiconductor device, the stress-relieving part is preferably formed in part of the upper electrode located outside the plurality of trenches.

In the above semiconductor device, the capacitive insulating film may contain $TaO_x$ and the lower electrodes may contain TiN.

According to another aspect of the present invention, a method for fabricating a semiconductor device having a plurality of capacitors, includes the steps of: (a) forming a plurality of lower electrodes; (b) forming a capacitive insulating film to cover the plurality of lower electrodes; and (c) forming an upper electrode to cover the surfaces of the plurality of lower electrodes from above with the capacitive insulating film interposed between the upper electrode and the plurality of lower electrodes and have a stress-relieving part.

The above method may further include the step of forming a plurality of trenches in an insulating film before the step (a), wherein, in the step (a), each said lower electrode may be formed to cover the entire surfaces of each said trench, and in the step (c), the upper electrode may be formed to cover the entire surfaces of the trenches and the insulating film located outside the plurality of trenches.

A method in which, in the step (c), the upper electrode is formed to have a thickness of 40 nm or more may be used as a specific method for forming a stress-relieving part. The largest thickness of the upper electrode is set at 150 nm.

A method in which, in the step (c), the upper electrode is formed at a temperature of 500° C. or more may be used as another specific method for forming a stress-relieving part. The highest temperature at which the upper electrode is formed is set at 700° C.

The capacitive insulating film may contain $TaO_x$ and the lower electrodes may contain TiN.

DETAILED DESCRIPTION OF THE INVENTION

Embodiment 1

A semiconductor device according to a first embodiment of the present invention will be described hereinafter with reference to the drawings.

Figure 1A:
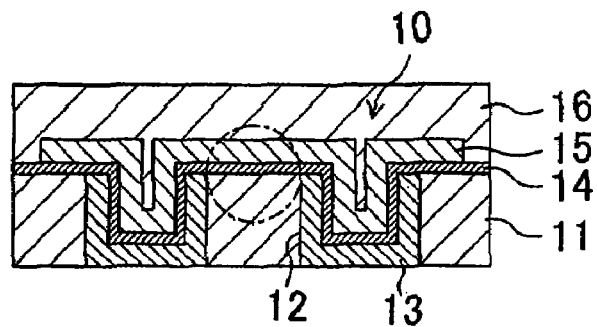
FIGS. 1A through 1D are diagrams showing a schematic structure of a semiconductor device according to a first embodiment of the present invention.

FIG. 1A is a cross-sectional view showing a schematic structure of the semiconductor device according to the first embodiment of the present invention. As shown in FIG. 1A, the semiconductor device of this embodiment includes a first interlayer insulating film 11, a plurality of lower electrodes 13 of a silicon film formed on the entire surfaces of a plurality of trenches 12 formed in the first interlayer insulating film 11, a capacitive insulating film 14 of a $TaO_x$ film formed to cover the entire surfaces of the lower electrodes 13, an upper electrode 15 of a TiN film covering part of the capacitive insulating film 14, and a second interlayer insulating film 16 covering the upper electrode 15. Each of DRAM capacitors is formed of one of the lower electrodes 13, the capacitive insulating film 14 and the upper electrode 15. The capacitive insulating film 14 and the upper electrode 15 are formed to cover the entire surfaces of the plurality of trenches 12 and the first interlayer insulating film 11 located outside the trenches 12.

Figure 1B:
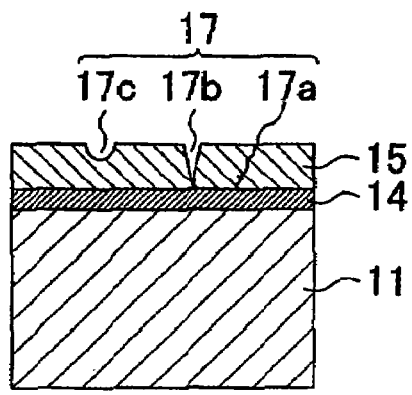

FIG. 1B is an enlarged cross-sectional view showing a part of the structure of the semiconductor device shown in FIG. 1A in which the capacitive insulating film 14 and the upper electrode 15 are successively stacked on the first interlayer insulating film 11, i.e., a part thereof surrounded by broken lines in FIG. 1A. As shown in FIG. 1B, the first interlayer insulating film 11, the capacitive insulating film 14 and the upper electrode 15 are successively stacked to make contact with one another. In this embodiment, the upper electrode 15 is formed with stress-relieving parts 17. The stress-relieving parts 17 represent cracks 17a, notches 17b and recesses 17c formed in the upper electrode 15. The stress-relieving parts 17 existing in a region of the upper electrode 15 located outside the trenches 12, i.e., a region thereof under which the lower electrodes 13 are not formed may be formed only in the top surface of the upper electrode 15 or may reach the capacitive insulating film 14 under the upper electrode 15. However, it is preferable that some of the stress-relieving parts 17 existing in parts of a semiconductor device inside the trenches 12, i.e., in parts thereof in which capacitors are formed of the upper electrode 15, the capacitive insulating film 14 and the lower electrodes 13, do not reach the capacitive insulating film 14.

Figure 1C:
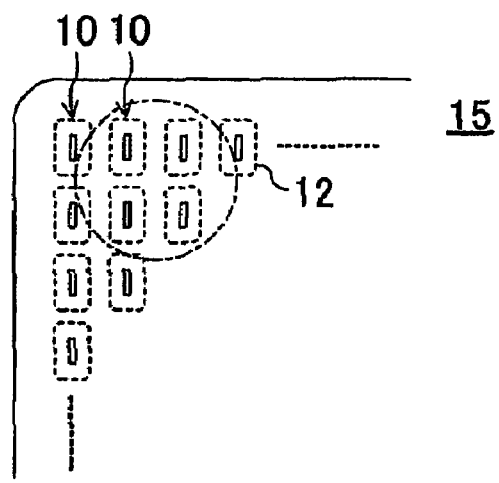

FIG. 1C is a plan view showing a schematic structure of a DRAM array region in which a plurality of DRAM capacitors 10 are arranged. As shown in FIG. 1C, the DRAM capacitors 10 are arranged in a matrix of rows and columns. For example, several 10K through 10 G capacitors are arranged in a single array. In this structure, an upper electrode 15 is formed to cover a plurality of trenches 12 and have a large area.

Figure 1D:
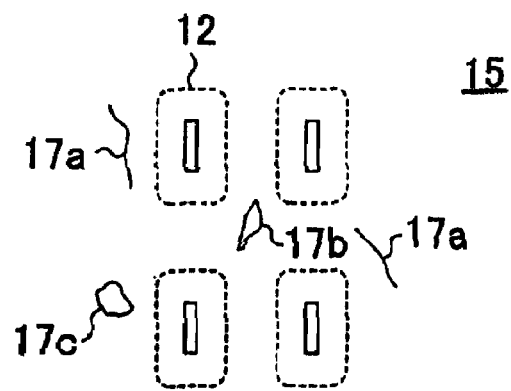

FIG. 1D is a plan view schematically showing the state of the stress-relieving parts 17 (17a, 17b and 17c) being formed in the DRAM array region. As shown in FIG. 1D, in the DRAM array region of this embodiment, the stress-relieving parts 17 are formed in part of the upper electrode 15 located outside the trenches 12 and immediately above the first interlayer insulating film 11 (shown in FIG. 1A). Although, as a matter of fact, the stress-relieving parts 17 are formed also in the region shown in FIG. 1C, they are not shown therein.

Since in this embodiment the stress produced in the upper electrode 15 is reduced by the stress-relieving parts 17, the stress applied from the upper electrode 15 to the capacitive insulating film 14 can be reduced. This can restrain the leakage current from passing through the capacitive insulating film 14 and permits charge retention in the capacitive insulating film 14 with reliability. Furthermore, the long-term reliability can be restrained from becoming worse.

In this embodiment, the stress is likely to concentrate, in particular, at part of the upper electrode 15 located outside the trenches 12. In particular, when stress-relieving parts 17 are therefore formed in the part of the upper electrode 15, the stress can be reduced more effectively.

Embodiment 2

A fabrication method for a semiconductor device according to a second embodiment of the present invention will be described hereinafter with reference to the drawings. In this embodiment, a method for forming the semiconductor device described in the first embodiment of the present invention will be described.

FIGS. 2A through 2G are cross-sectional views showing the fabrication method for a semiconductor device according to the second embodiment of the present invention. In the step of the fabrication method of this embodiment shown in FIG. 2A, a 500-nm-thick first interlayer insulating film 11 of a silicon oxide film is first formed on a front-end film 18, such as a semiconductor substrate.

Figure 2A:
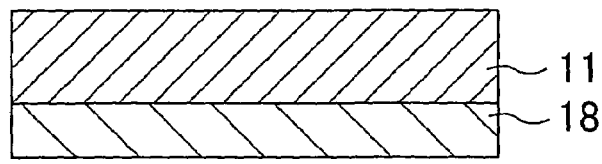
FIGS. 2A through 2G are cross-sectional views showing a fabrication method for a semiconductor device according to a second embodiment of the present invention.
Figure 2B:
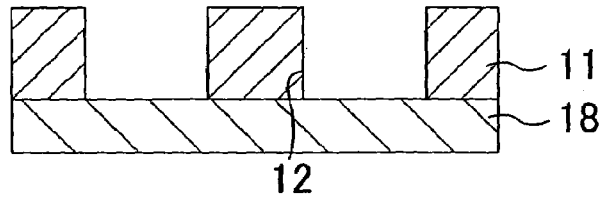

Next, in the step shown in FIG. 2B, a resist mask (not shown) is formed on the first interlayer insulating film 11 by photolithography, and the first interlayer insulating film 11 is subjected to dry etching using the resist mask. In this way, trenches 12 each having an opening with a size of 0.2 μm×0.4 μm are formed to pass through the first interlayer insulating film 11 and reach the front-end film 18.

Figure 2C:
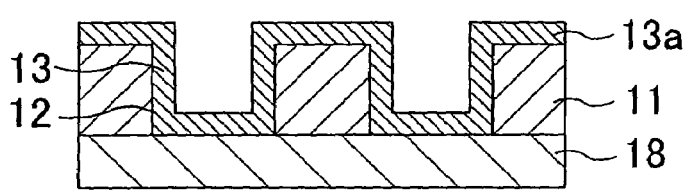

Next, in the step shown in FIG. 2C, a 30-nm-thick silicon film (containing polysilicon and amorphous silicon) 13a is formed by CVD to cover the entire surfaces of the trenches 12 and the first interlayer insulating film 11 located outside the trenches 12.

Figure 2D:
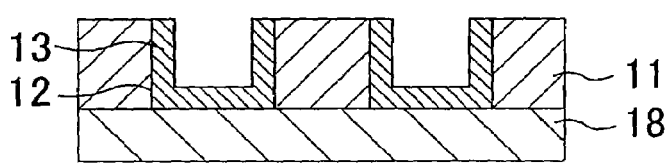

Next, in the step shown in FIG. 2D, a resist mask (not shown) is formed on the silicon film 13a by photolithography to fill the trenches 12 and expose part of the silicon film 13a located between (outside) the trenches 12. Thereafter, the exposed parts of the silicon film 13a are removed by dry etching from above the resist mask, thereby forming lower electrodes 13 in the trenches 12.

Figure 2E:
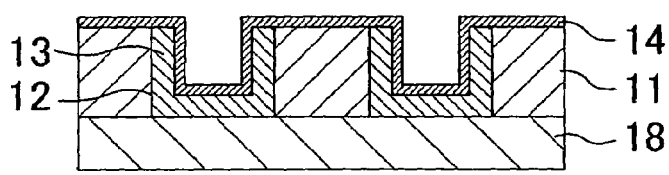

Next, in the step shown in FIG. 2E, a 10-nm-thick capacitive insulating film 14 of $TaO_x$ is formed by thermal CVD at a temperature of 450° C. to cover the entire surfaces of the lower electrodes 13 formed in the trenches 12 and the first interlayer insulating film 11 located outside the trenches 12.

Figure 2F:
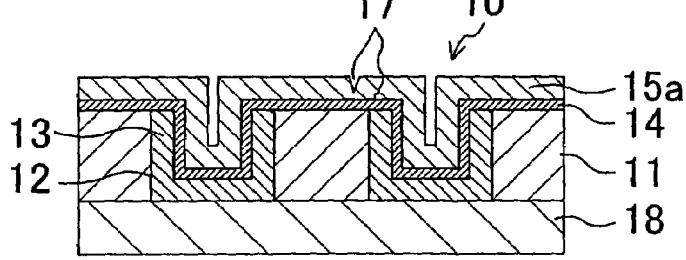

Next, in the step shown in FIG. 2F, while a material containing $TiCl_4$ and $NH_3$ as the main ingredients is supplied to the entire substrate region, a TiN film 15a for an upper electrode is formed on the capacitive insulating film 14 by CVD. The thickness of a TiN film required to form an upper electrode is typically about 30 nm. However, in this embodiment, a TiN film is formed to have a thickness of 40 nm or more that is thicker than the above-described thickness. This makes it easier that the TiN film 15a is formed with stress-relieving parts 17.

Figure 2G:
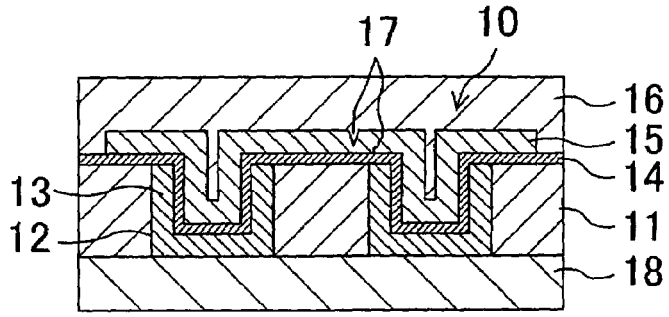

Next, in the step shown in FIG. 2G, a resist mask (not shown) is formed on the TiN film 15a by photolithography, and then unnecessary part of the TiN film 15a is removed by dry etching using the resist mask. In this way, an upper electrode 15 is formed to cover the entire surfaces of the trenches 12 and the first interlayer insulating film 11 located between (outside) the trenches.

Thereafter, a second interlayer insulating film 16 is formed to cover the upper electrode 15 such that its part located outside the trenches 12 has a thickness of 300 nm. Then, although not shown, contact plugs and interconnects are formed to pass through the second interlayer insulating film 16.

Figure 3A:
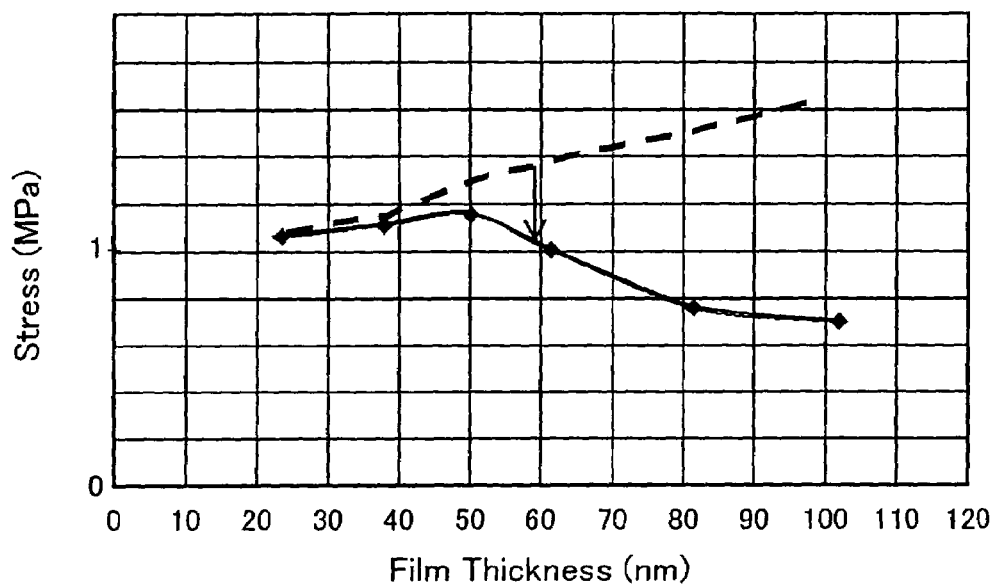
FIG. 3A is a graph showing the relationship between the thickness of a TiN film and the stress produced in the TiN film.

FIG. 3A is a graph showing the relationship between the thickness of the TiN film and the stress produced in the TiN film. In FIG. 3A, an axis of abscissas represents the thickness of the TiN film, and an axis of ordinates represents the magnitude of the stress produced in the TiN film. In FIG. 3A, the profile shown by a solid line shows the stress obtained by actual measurement, and the profile shown by broken lines shows the stress that it is expected would be produced if the TiN film was formed without any stress-relieving part. As shown in FIG. 3A, when the thickness of the TiN film is up to about 40 nm, the profile shown by broken lines substantially coincides with the profile shown by a solid line. However, it is found that when the thickness of the TiN film becomes 40 nm or more, a difference is made between the two profiles and the stress obtained by actual measurement is smaller than would be expected. When the thickness of the TiN film is more than 50 nm, the stress obtained by actual measurement is decreasing with an increase in the thickness thereof. In particular, when the thickness of the TiN film is 60 nm or more, the stress becomes smaller than when the thickness thereof is 20 through 30 nm. As described above, when the thickness of the TiN film is about 40 nm or more, the stress obtained by actual measurement is smaller than would be expected, and when the thickness thereof is about 50 nm or more, the stress decreases. The reason for this is that the TiN film is formed with stress-relieving parts.

Since in this embodiment the upper electrode 15 is formed to become thick, the upper electrode 15 can be easily formed with the stress-relieving parts 17 without adding particular process steps. In the semiconductor device formed by the method of this embodiment, the stress produced in the upper electrode 15 can be relieved by the stress-relieving parts 17. This can reduce the stress applied from the upper electrode 15 to the capacitive insulating film 14. This can ensure excellent leakage current characteristics and excellent charge retention characteristics of the capacitive insulating film 14 and restrain the long-term reliability from becoming worse.

In this embodiment, since the stress is likely to concentrate, in particular, at parts of the upper electrode located outside the plurality of trenches 12, the formation of the stress-relieving parts 17 in the above-described parts can more effectively reduce the stress.

Embodiment 3

A fabrication method for a semiconductor device according to a third embodiment of the present invention will be described below again with reference to FIGS. 2A through 2G.

In the steps of the fabrication method of this embodiment shown in FIGS. 2A through 2E, the same steps as in the second embodiment are carried out. In the step shown in FIG. 2F, while a material containing $TiCl_4$ and $NH_3$ as the main ingredients is supplied to the entire substrate region, a TiN film 15a is formed on the capacitive insulating film 14 by thermal CVD at a temperature of 500° C. or more. Then, in the step shown in FIG. 2G, the same step as in the second embodiment is carried out.

Figure 3B:
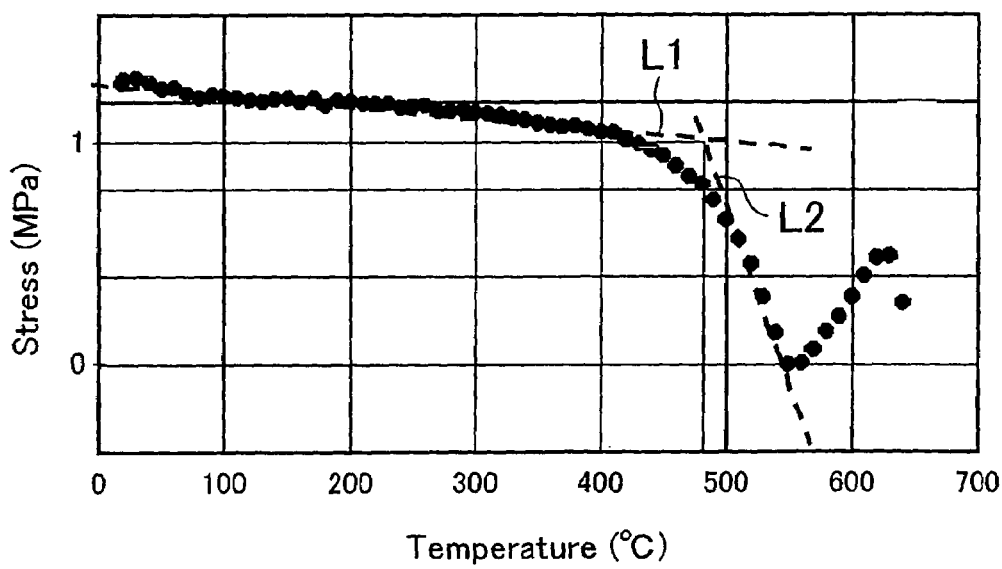
FIG. 3B is a graph showing the relationship between the temperature at which the TiN film is deposited and the stress produced in the TiN film.

FIG. 3B is a graph showing the relationship between the temperature at which the TiN film is deposited and the stress produced in the TiN film. As shown in FIG. 3B, within a temperature range of 400° C. or less, the stress in the TiN film decreases gently with an increase in temperature. After the temperature at which the TiN film is deposited reached about 400° C., the degree of stress decrease to the temperature gradually increases. After the temperature reached 500° C., the stress remarkably decreases. Assumed that the broken lines showing variations in stress at temperatures lower than 400° C. (at low temperatures) are referred to as L1 and the broken lines showing variations in stress at temperatures of 500° C. or more (at high temperatures) are referred to as L2, the temperature at an intersection point of the broken lines L1 and L2 is 480° C. It is seen from the above that a temperature range of 400° C. through 500° C. corresponds to a transitory stage in which the stress decrease begins being exhibited which results from the formation of the stress-relieving parts in the TiN film and the stress in the TiN film has sharply varied immediately after the temperature reached a temperature of 480° C. Since a remarkable stress decrease can be exhibited, in particular, within a temperature range of 500° C. or more, a TiN film is preferably formed at a temperature of 500° C. or more.

Since in this embodiment the upper electrode 15 is formed at a high temperature, the upper electrode 15 can be easily formed with the stress-relieving parts 17 without adding particular process steps. In the semiconductor device formed by the method of this embodiment, the stress produced in the upper electrode 15 can be relieved by the stress-relieving parts 17. This can reduce the stress applied from the upper electrode 15 to the capacitive insulating film 14. This can ensure excellent leakage current characteristics and excellent charge retention characteristics of the capacitive insulating film 14 and restrain the long-term reliability from becoming worse.

Other Embodiments

Although in the above-described embodiments a description was given of the case where the lower electrodes 13 are made of a silicon film, the same effects can be achieved in the present invention even when the lower electrodes 13 are made of a metal film or a TiN film.

Furthermore, although in the above-described embodiments the capacitive insulating film 14 is made of $TaO_x$ and the upper electrode 15 is made of TiN, other materials can be used for the capacitive insulating film 14 and the upper electrode 15 in the present invention. For example, alumina or $HfO_2$ may be used for the capacitive insulating film 14, and Pt, WN, TaN, TiAlN, TiSiN, or RuO may be used for the upper electrode 15.

The step of roughening the entire surfaces of the silicon film 13a may be added after the step of each of the second and third embodiments shown in FIG. 2C. Alternatively, the step of roughening the entire surfaces of the lower electrodes 13 may be added after the step of each of the second and third embodiments shown in FIG. 2D. This roughening step permits the formation of irregularities at the entire surfaces of the lower electrodes 13, resulting in the increased surface area of each lower electrode 13. This can lead to the increased capacitance of a capacitor in the same capacitor area.

After the step of each of the second and third embodiments shown in FIG. 2C, phosphorus (P) may be introduced into the silicon film 13a while the silicon film 13a is subjected to heat treatment. Alternatively, after the step of each of the second and third embodiments shown in FIG. 2D, phosphorus may be introduced into the lower electrodes 13 while the lower electrodes 13 are subjected to heat treatment.

Figure 4A:
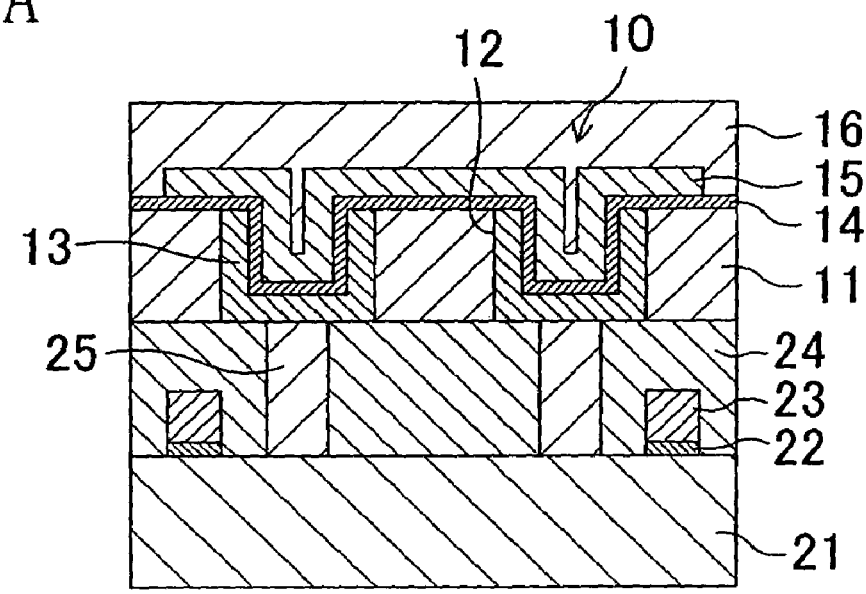
FIG. 4A is a cross-sectional view showing the structure of a semiconductor device when DRAM capacitors are formed above transfer gates.
Figure 4B:
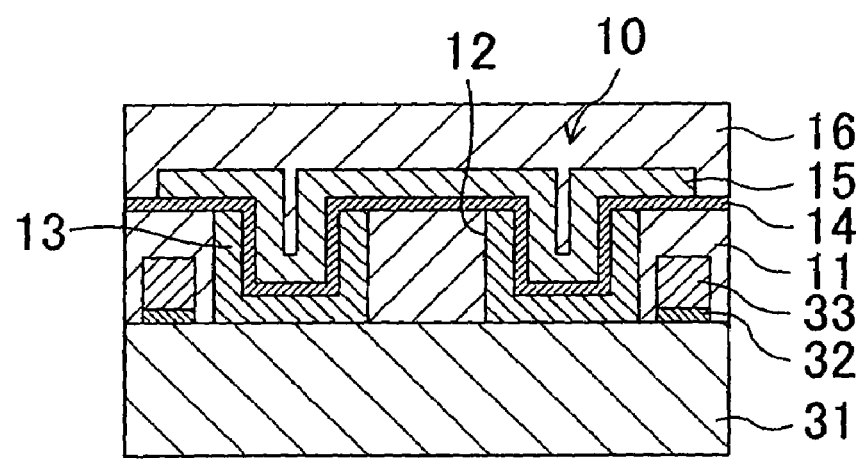
FIG. 4B is a cross-sectional view showing the structure of a semiconductor device when DRAM capacitors are formed directly on a semiconductor substrate.
Figure 5A:
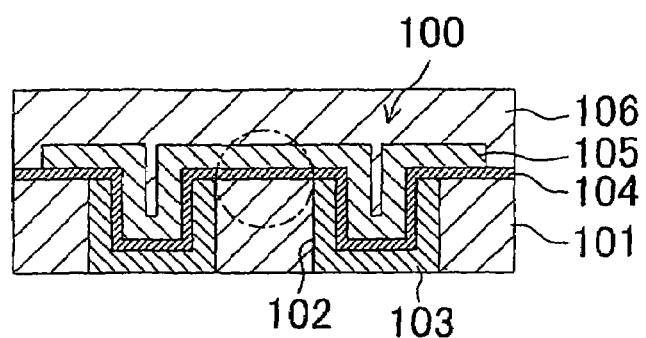
FIGS. 5A through 5D are diagrams showing a schematic structure of a known semiconductor device including DRAM capacitors.
Figure 5B:
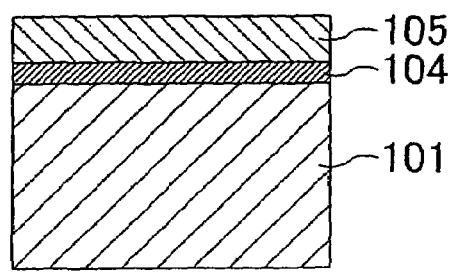
Figure 5C:
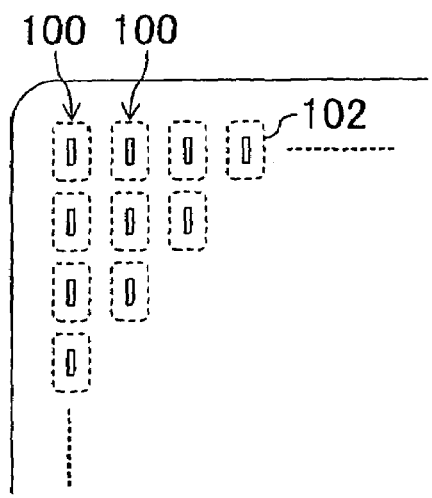
Figure 5D:
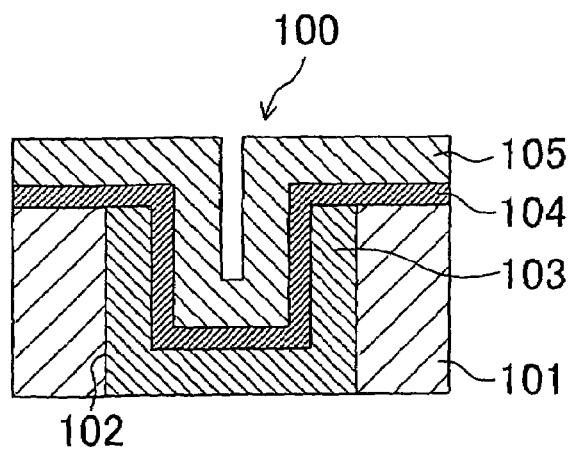

The DRAM capacitors described in the above-described embodiments may be formed in such capacitor formation regions of the semiconductor device as are shown in FIGS. 4A and 4B.

FIG. 4A is a cross-sectional view showing the structure of a semiconductor device when DRAM capacitors are formed above transfer gates. In the structure of the semiconductor device shown in FIG. 4A, pairs of gate insulating films 22 and gate electrodes 23 are formed on a semiconductor substrate 21, and an interlayer insulating film 24 is formed on the semiconductor substrate 21 to cover the pairs of the gate insulating films 22 and the gate electrodes 23. A plurality of metal plugs 25 are formed in the interlayer insulating film 24 to reach the semiconductor substrate 21. The first interlayer insulating film 11 described in the above-described embodiments is formed on the interlayer insulating film 24. A plurality of trenches 12 are formed in the first interlayer insulating film 11, and the metal plugs 25 are exposed at the bottoms of the trenches 12. DRAM capacitors 10 are formed in the trenches 12 formed in the first interlayer insulating film 11. The lower electrodes 13 of the DRAM capacitors 10 are electrically connected through the metal plugs 25 to the semiconductor substrate 21. Since the structure of each DRAM capacitor 10 is the same as in the above-described embodiments, a description thereof is not given.

FIG. 4B is a cross-sectional view showing the structure of a semiconductor device when DRAM capacitors are formed directly on a semiconductor substrate. In the structure of the semiconductor device shown in FIG. 4B, pairs of gate insulating films 32 and gate electrodes 33 are formed on a semiconductor substrate 31, and a first interlayer insulating film 11 is formed on the semiconductor substrate 31 to cover the pairs of the gate insulating films 32 and the gate electrodes 33. A plurality of trenches 12 are formed in parts of the first interlayer insulating film 11 except for parts thereof covering the pairs of the gate insulating films 32 and the gate electrodes 33. The semiconductor substrate 31 is partly exposed at the bottoms of the trenches 12. The DRAM capacitors 10 are formed in the trenches 12, and the lower electrodes 13 of the DRAM capacitors 10 make direct contact with the semiconductor substrate 31. Since the structure of each DRAM capacitor 10 is the same as in the above-described embodiments, a description thereof is not given.

What is claimed is:

1. A method for fabricating a semiconductor device having a plurality of concave capacitors, said method comprising the steps of:

(a) forming an insulating film with a plurality of trenches on a semiconductor substrate;

(b) forming a plurality of lower electrodes so as to only cover inner surfaces of said trenches in a conforming manner not completely burying said trenches;

(c) forming a capacitive insulating film on the plurality of lower electrodes; and (d) forming an upper electrode covering the surfaces of the plurality of lower electrodes from above with the capacitive insulating film interposed between the upper electrode and the plurality of lower electrodes and have a stress-relieving part, wherein each said capacitor comprises one of said lower electrodes, said capacitive insulating film and said upper electrode, said upper electrode covers the surfaces of said insulating film located outside said plurality of trenches, and said stress-relieving part is formed in a part of said upper electrode including the surface thereof and covering the surfaces of said insulating film located outside said plurality of trenches.

2. The method of claim 1,
wherein, in the step (b), each said lower electrode is formed to cover the entire surfaces of each said trench.

3. The method of claim 1, wherein
in the step (d), the upper electrode is formed to have a thickness of 40 nm or more.

4. The method of claim 1, wherein
in the step (d), the upper electrode is formed at a temperature of 500° C. or more.

5. The method of claim 1, wherein
the capacitive insulating film contains $TaO_x$ and the lower electrodes contain TiN.

* * * * *